United States Patent [19]

Hernandez et al.

[11] Patent Number: 5,095,402
[45] Date of Patent: Mar. 10, 1992

[54] INTERNALLY DECOUPLED INTEGRATED CIRCUIT PACKAGE

[75] Inventors: Jorge M. Hernandez, Mesa; Michael S. Hyslop, Chandler, both of Ariz.

[73] Assignee: Rogers Corporation, Rogers, Conn.

[21] Appl. No.: 591,778

[22] Filed: Oct. 2, 1990

[51] Int. Cl.⁵ .................... H01G 1/14; H01L 23/02
[52] U.S. Cl. ........................... 361/306; 357/74
[58] Field of Search ............ 361/306, 406; 174/72 B; 357/72, 74, 81

[56] References Cited

U.S. PATENT DOCUMENTS

| | | | |
|---|---|---|---|
| 4,922,324 | 5/1990 | Sudo | 357/74 |
| 4,945,399 | 7/1990 | Brown et al. | 357/74 |
| 4,989,117 | 1/1991 | Hernandez | 361/306 |

FOREIGN PATENT DOCUMENTS 2137833 10/1984 United Kingdom .

OTHER PUBLICATIONS

European Search Report, 5/1991, EP 91 10 0653, Hitachi.
Multilayer Ceramic Capacitors and IC's; E. Philofsky; Electronic Engineering, Jun. 1982.
Functional Testing of Decoupling Capacitors for Dynamic Rams; A. G. Martin; AVX Ceramics & Ward Parkinson; Micron Technology, 1982.

Primary Examiner—Donald A. Griffin
Attorney, Agent, or Firm—Fishman, Dionne & Cantor

[57] ABSTRACT

A decoupling scheme is presented which is well suited for use with any type of integrated circuit package. In accordance with the present invention, a flat decoupling capacitor is attached directly to the top of an IC die and is electrically connected to the IC by means of raised conductive bumps provided either on the surface of the decoupling capacitor or on the IC die surface. These conductive bumps interconnect the internal electrodes of the capacitor to the power and ground circuits of the IC. The resulting decoupling scheme provides a decoupling loop with an inductance which is significantly lower than previously disclosed decoupling loops.

28 Claims, 9 Drawing Sheets

INTERNALLY DECOUPLED INTEGRATED CIRCUIT PACKAGE

BACKGROUND OF THE INVENTION

This invention relates to the field of integrated circuit packaging. More particularly, this invention relates to a method of suppressing noise (e.g. decoupling) from the voltage to ground distribution circuit in integrated circuit packages such as surface mounted leaded or leadless chip carriers, dual-in-line packages, pin grid array packages and quad flat packages.

It is well known in the field of microelectronics that high frequency operation, particularly the switching of integrated circuits, can result in transient energy being coupled into the power supply circuit. It is also well known that integrated circuits are becoming more dense (more gates per unit area of silicon/or gallium arsenide), more powerful (more watts per unit area of IC chip), and faster with higher clock rate frequencies and with smaller rise times. All of these recent and continued developments make the problem of suppressing noise in the power bus (produced by a large amount of simultaneous gates switching) even more serious than in the past.

Generally, the prevention of the coupling of undesired high frequency noise or interference into the power supply for an integrated circuit is accomplished by connecting a decoupling capacitor across the power and the ground leads of the IC. Conventional methods of decoupling (noise suppression) include the use of decoupling capacitors external to the IC package, such as monolithic multilayer ceramic chip capacitors. One external connection scheme of this type which has been found to be quite successful is to mount a decoupling capacitor underneath an integrated circuit. Such decoupling capacitors are commercially available from Rogers Corporation (assignee of the present application) and are sold under the trademark MICRO Q. Examples of these decoupling capacitors are found in U.S. Pat. Nos. 4,475,143, 4,502,101 and 4,748,537, all of which are assigned to the assignee hereof. U.S. Pat. Nos. 4,626,958, 4,667,267, 4,658,327, 4,734,818, 4,734,819 and 4,853,826 are also assigned to the assignee hereof. These patents disclose decoupling capacitors which are particularly well suited for pin grid array and plastic leaded chip carrier packages.

Still other decoupling connection schemes are known. For example, multilayer capacitor (MLC) chips have been placed on top of PGA ceramic IC packages with interconnections built-in from the surface of the PGA package down to the proper places in internal circuitry of the package. In still some other cases, schemes have been devised to incorporate a MLC chip into a specially configured IC lead frame, but due to production difficulties, this approach has not become widely accepted. Attempts have also been made to build a capacitive layer into a PGA ceramic package (and into a leadless ceramic chip carrier), by using thin layers of alumina or other adequate ceramic dielectric material. Again, this approach has not found wide acceptance.

For a number of years, the users of integrated circuits have been aware of the need to reduce the inductance of the decoupling loop, so that switching noise can be minimized. The best way to accomplish this is by placing the decoupling capacitor as close to the IC chip (silicon or gallium arsenide) as possible. Ideally, the decoupling capacitor should be built in with the IC itself. U.S. Patent Application Ser. Nos. 479,071, 479,074 and 479,075, all of which were filed on Feb. 12, 1990, and are assigned to the assignee hereof, disclose various methods of incorporating decoupling capacitors directly within IC packages. While all of these IC packaging schemes result in significantly lower inductance than associated with prior techniques, there nevertheless continues to be a need for improved connection schemes for decoupling undesired high frequency noise from integrated circuits wherein the inductance within the decoupling loop is reduced to as low a level as possible.

SUMMARY OF THE INVENTION

The above-discussed and other problems and deficiencies of the prior art are overcome or alleviated by the decoupling scheme of the present invention which is well suited for use with any type of integrated circuit package. In accordance with the present invention, a flat decoupling capacitor is attached directly to the top of the IC die and is electrically connected to the IC by means of raised conductive bumps provided either on the surface of the decoupling capacitor or on the IC die surface. These conductive bumps interconnect the internal electrodes of the capacitor to the power and ground circuits of the IC. The resulting decoupling scheme provides a decoupling loop with an inductance which is significantly lower than previously disclosed decoupling loops.

Preferably, the decoupling capacitor comprises a ceramic substrate having a pair of electrodes and interleaved dielectric and conductive layers deposited thereon using known thick or thin film techniques such as described in U.S. Patent Application Ser. Nos. 479,095 filed Feb. 12, 1990 and 479,071 filed Feb. 12, 1990, both of which are assigned to the assignee hereof and fully incorporated herein by reference. In one embodiment of this decoupling capacitor, vias are incorporated in the several layers and each terminates at a solder bump. In another embodiment of this capacitor, the vias terminate at a recessed region for mating with a solder bump located on the IC die.

The above-discussed and other features and advantages of the present invention will be appreciated and understood from the following detailed description and drawings.

BRIEF DESCRIPTION OF THE DRAWINGS

Referring now to the drawings wherein like elements are number alike in the several Figures.

DESCRIPTION OF THE PREFERRED EMBODIMENT

Figure 1A:
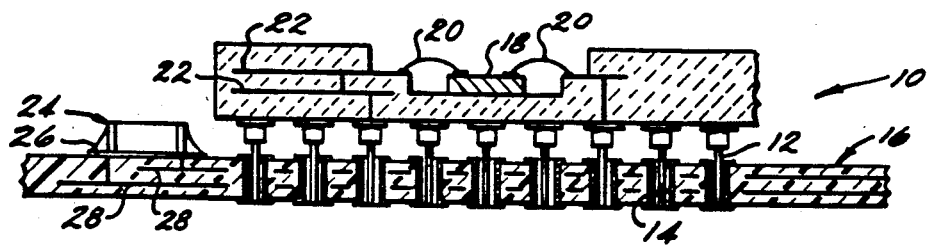
FIG. 1A is a cross-sectional elevation view of a decoupling scheme in accordance with the prior art.

Referring first to FIGS. 1-4, several decoupling schemes for use in conjunction with different types of integrated circuit packages (i.e, pin grid array (PGA) packages and plastic leaded chip carrier (PLCC) packages) are shown. Turning first to FIGS. 1A and 1B, a PGA package 10 is shown electrically interconnected by a plurality of pins 12 to through holes 14 in a multilayer printed wiring board 16. Within PGA package 10 is an integrated circuit chip 18 which is wire bonded at 20 to voltage, ground and signal planes 22 within package 10. Positioned exteriorly on circuit board 16 is a multilayer chip capacitor 24 which is connected at surface mounting pads 26 to voltage and ground planes 28 of multilayer circuit board 16.

Figure 1B:
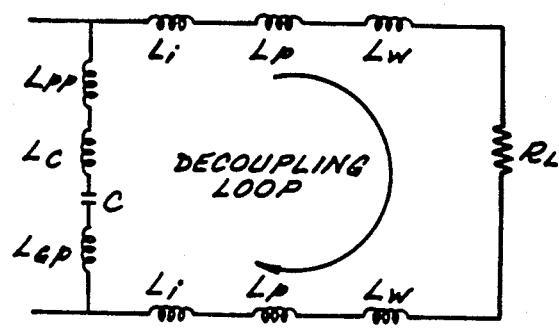
FIG. 1B is a circuit diagram of the decoupling loop of FIG. 1A.

Referring to FIG. 1B, the decoupling scheme of FIG. 1A will exhibit a relatively large inductance as shown by the decoupling loop in the schematic of FIG. 1B wherein $L_i$ is equal to the inductance of those printed wiring board internal portions of the voltage plane from the capacitor mounting pads to the PGA voltage pin; $L_P$ is equal to the inductance of the PGA voltage pins plus the interconnecting vias plus that portion of the PGA voltage plane to the point of wire bonding; $L_W$ is equal to the inductance of the bonding wire; $R_L$ is equal to the resistive load representing the power dissipated by the IC die; $L_{PP}$ is equal to the inductance of the interconnecting via from the printed wiring board voltage/ground plane to the multilayer capacitor mounting pad (with the second set of $L_W$, $L_P$ and $L_I$ accounting for the ground side of the circuit); $L_C$ is equal to the inductance of the decoupling capacitor; and C is equal to the capacitance of the decoupling capacitor.

Figure 2A:
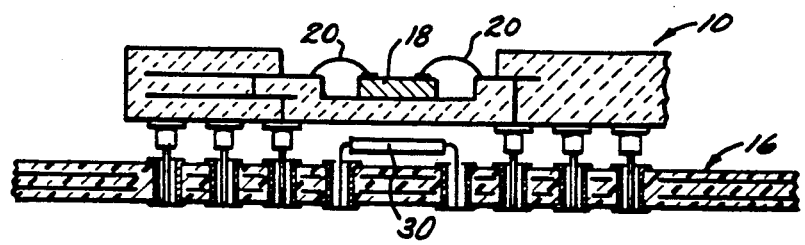
FIG. 2A is a cross-sectional view of another decoupling scheme in accordance with the prior art.
Figure 2B:
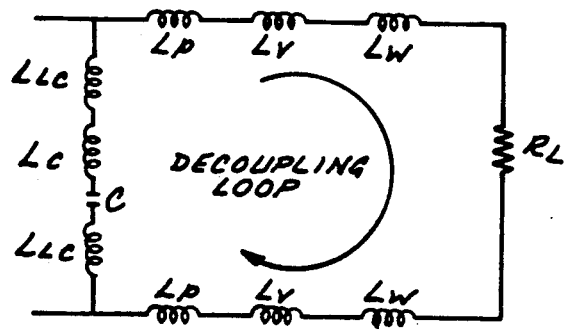
FIG. 2B a circuit diagram of the decoupling loop of FIG. 2A.

In FIG. 2A, a second prior art decoupling configuration is shown wherein a decoupling capacitor 30 is positioned underneath PGA package 10 in a configuration similar to that depicted in U.S. Pat. No. 4,626,958 which is assigned to the assignee hereof and incorporated herein by reference. As shown in FIG. 2B, the decoupling scheme of FIG. 2A has less inductance than that of FIG. 1A but is nevertheless relatively high. In FIG. 2B, $L_P$ is equal to the inductance of the PGA voltage/ground pins; $L_V$ is equal to the inductance of the internal PGA via interconnections for voltage and ground, plus portions of voltage and ground PGA planes; $L_W$ is equal to the inductance of the bonding wire; $R_L$ is equal to the resistive load representative of the power dissipated by the IC die; $L_{LC}$ is equal to the inductance of the pins of the decoupling capacitor; $L_C$ is equal to the inductance of the body of the decoupling capacitor; and C is equal to the capacitance of the decoupling capacitor.

Figure 3A:
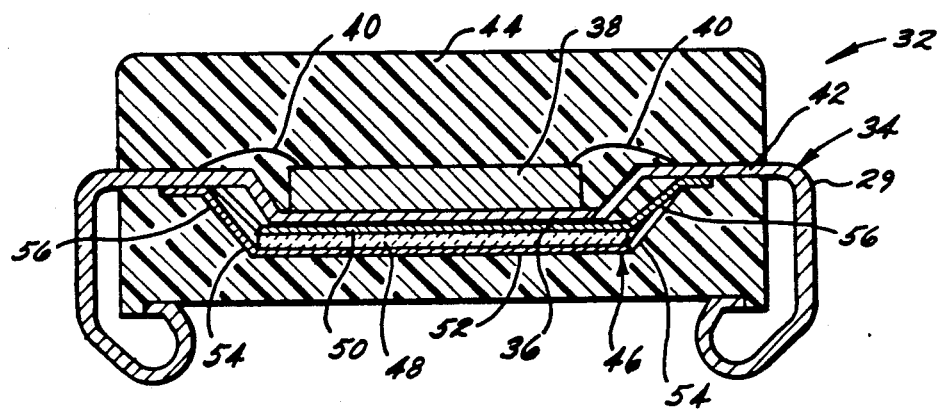
FIG. 3A is a cross-sectional elevation view of a decoupling scheme in accordance with U.S. Application Ser. No. 479,075 filed Feb. 12, 1990.

Turning now to FIG. 3A, a molded integrated circuit chip carrier package in accordance with copending U.S. Application Ser. No. 479,075 filed Feb. 12, 1990 (which is assigned to the assignee hereof, and fully incorporated herein by reference) is shown generally at 32. Package 32 includes a lead frame 34 wherein the die support platform 36 supports an integrated circuit chip 38 which has been wire bonded via wire bonds 40 to fingers 42 of lead frame 32. The lead frame 32 and IC chip 38 have been encapsulated in a molded package 44. A thin parallel plate decoupling capacitor 46 is attached to the bottom surface of die support platform 36 which is opposite the surface thereof supporting integrated circuit chip 38. Decoupling capacitor 46 comprises a thin layer of dielectric material 48 which is preferably a ceramic. Dielectric layer 48 is sandwiched between an upper conductor 50 and a lower conductor 52. Each conductor 50 and 52 includes a plurality of leads 54 and 56, respectively, extending therefrom and bonded to selected fingers of the lead frame 42.

Figure 3B:
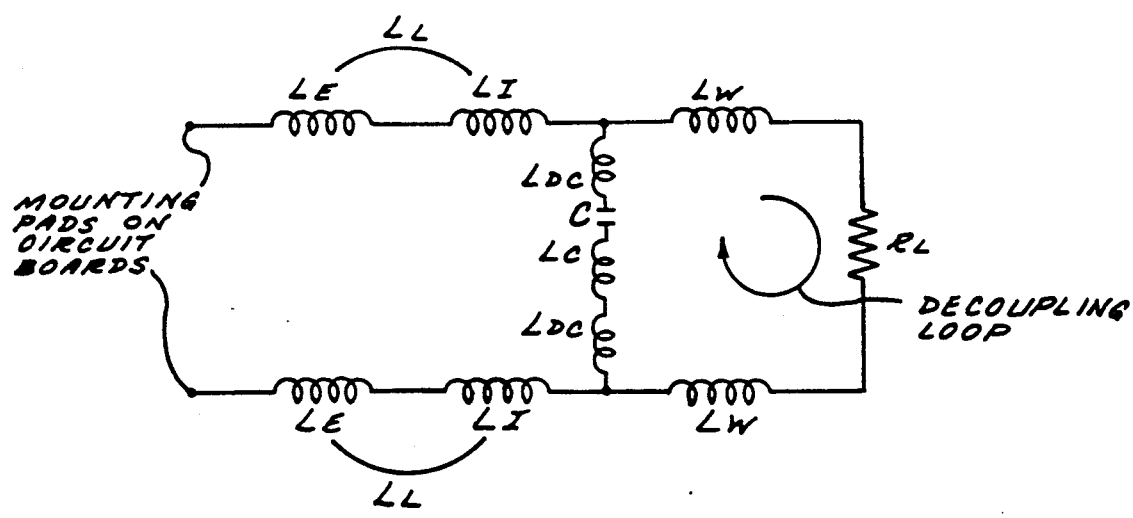
FIG. 3B a circuit diagram of the decoupling loop of FIG. 3A.

While the internal decoupling scheme of FIG. 3A is superior to the known external decoupling methods of FIGS. 1A and 2A, this assembly nevertheless has a level of inductance which may be undesirably high. Referring to FIG. 3B, a circuit diagram for the decoupling scheme of FIG. 3A is shown wherein;

C=Capacitance of the decoupling capacitor;

$L_E$=Inductance of the lead frame from the mounting pad to the lead ingress to the package;

$L_I$=Inductance of the lead frame from the point of ingress of the lead, to the point of bonding of the bonding wire;

$L_W$=Inductance of the bonding wire;

$R_L$=Resistive load (represents energy consumption in the IC circuit); and $L_{DC}$=Inductance of the parallel plate structure of the decoupling capacitor.

Figure 4A:
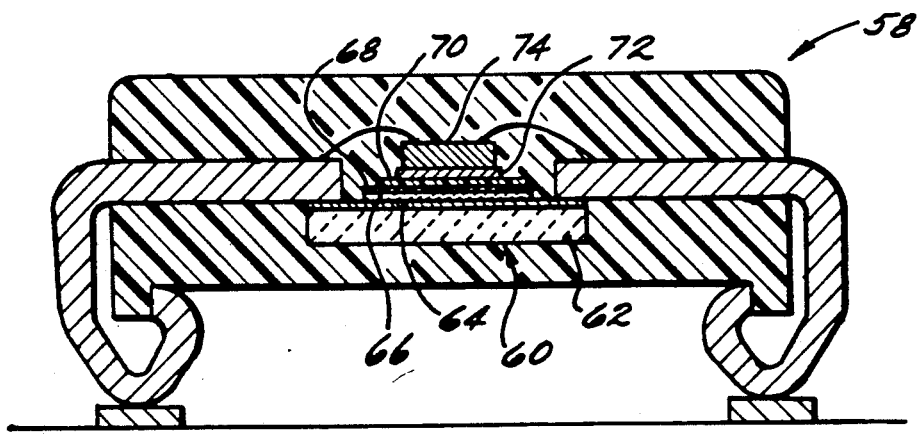
FIG. 4A is a cross-sectional elevation view of a decoupling scheme in accordance with U.S. Application Ser. No. 479,071 filed Feb. 12, 1990.

Referring now to FIG. 4A, an internally decoupled IC package which exhibits an even smaller decoupling loop than the IC package of FIG. 3A is shown generally at 58. Internally decoupled IC package 58 is disclosed in more detail in U.S. Application Ser. No. 479,071 filed Feb. 12, 1990 which has already been incorporated herein by reference. IC package 58 comprises a molded encapsulant and lead frame similar to the package of 3A. Package 58 incorporates a thin capacitor which avoids the high inductance leaded structure of capacitor 46 in FIG. 3A. This capacitor is shown generally at 60 and includes a relatively thick base or substrate 62 which is preferably made of a ceramic material. A first or lower electrode 64 is printed on base 52. A thin layer of dielectric material 66 is positioned on electrode 64 and a second or upper electrode 68 is then printed on the upper surface of dielectric layer 66. A protective non-conductive layer 70 is printed on second electrode 68 followed by an optional conductive layer 72 to which is mounted an integrated circuit chip 74.

Figure 4B:
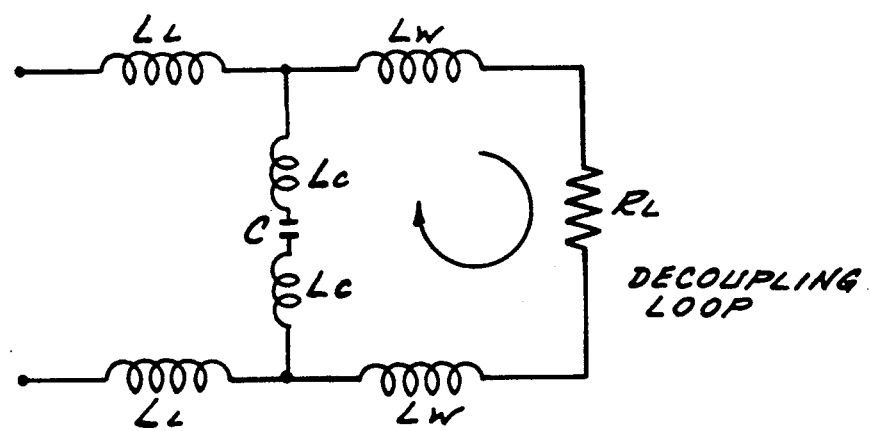
FIG. 4B is a circuit diagram of the decoupling loop of FIG. 4A.

With reference to FIG. 4B, the approximate decoupling scheme is shown wherein $L_L$ is equal to the inductance of the leads from the point of connection to the surface mounted pad and to the point of connection to the bonding wire; $L_W$ is equal to inductance of the bonding wire; $R_L$ is equal to the resistive load representing the power consumed by the IC; $L_C$ is equal to the inductance of the capacitor from the point of connection to the lead frame to the capacitor body itself (and includes a self-inductance of the capacitor body); and C is equal to the capacitance of the decoupling capacitor.

While the decoupling scheme of FIG. 4A is superior to convention decoupling schemes and to the novel decoupling scheme of FIG. 3A, all of these decoupling systems still exhibit a relatively significant amount of inductance in the decoupling loop.

Figure 5A:
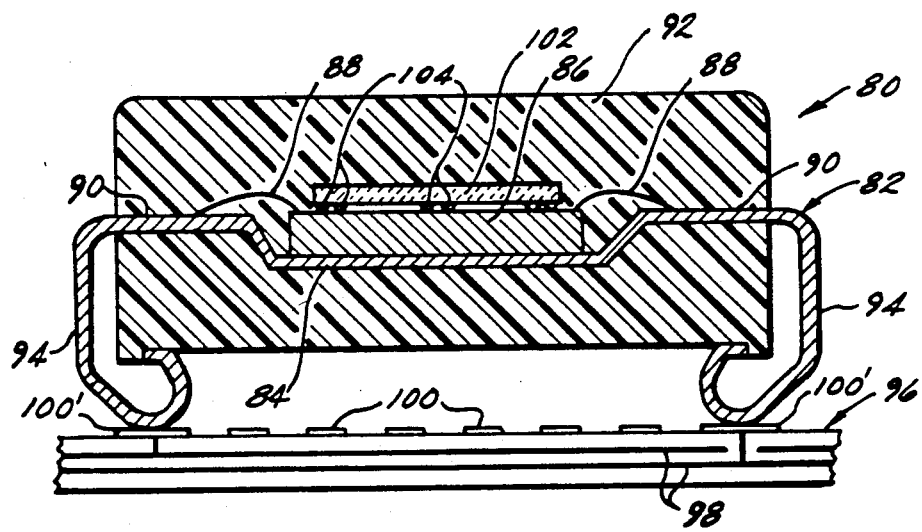
FIG. 5A is a cross-sectional elevation view of an internally decoupled IC package in accordance with a first embodiment of the present invention.

In accordance with the present invention, a decoupling scheme for an IC package of any type including surface mounted leaded or leadless chip carriers, dual-in-line packages, pin grid array packages and quad flat packages is provided which reduced the inductance of the decoupling loop to an extent even greater than that associated with any of the foregoing decoupling schemes of FIG. 1-4. With reference to FIG. 5A, the reduction of inductance in the decoupling loop is accomplished by placing the decoupling capacitor right on top of the integrated circuit die (silicon or gallium arsenide). Connections between the decoupling capacitor and the IC die are accomplished by one of two ways. In a first connection embodiment, the capacitor can be "bumped" and placed face down onto the IC die so that the "bumps" connect directly to metallization pads o the surface of the IC (said pads corresponding to the voltage and ground connections of the IC). In a second connection method, the IC itself can be bumped and pads are provided on the surface of the capacitor corresponding to the voltage and ground bumps of the IC die. The first connection method is shown in FIGS. 5A and 5B and the second connection method is shown in FIGS. 6A and 6B.

Referring now to the first embodiment of FIG. 5A, a plastic leaded chip carrier IC package in accordance with the present invention is shown generally at 80. Package 80 includes a lead frame 82 having a die support platform 84 which supports an integrated circuit chip 86. Chip 86 has been wire bonded via wire bonds 88 to the fingers 90 of lead frame 82. The lead frame 80 and IC chip 86 has been encapsulated in a molded package 92. It will be appreciated that the ends of each finger 90 have been bent so as to form J-leads 94. Of course, any other lead configuration may be used in conjunction with the present invention. IC package 80 is electrically connected to a circuit board 96 which has a series of voltage and ground planes 98 and a plurality of surface mountable installation pads 100. Both J-leads 94 are electrically connected to pads 100' which in turn are connected to selected voltage and/or ground planes 98.

As will be discussed in more detail with regard to FIGS. 8 and 9, a decoupling capacitor 102 in accordance with the present invention is provided with conductive solder bumps 104 which in turn are connected to selected metallized pads on IC die 86. In turn, the IC die pads interconnect with the voltage and ground connections of the IC.

Figure 5B:
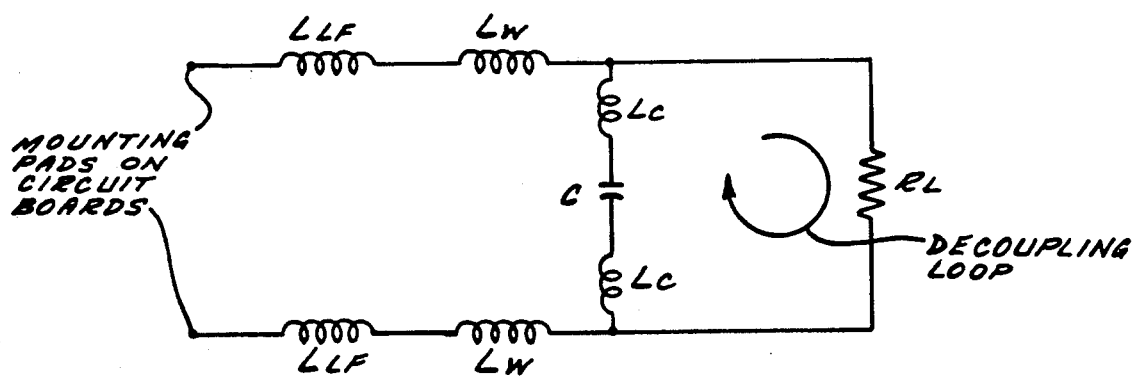
FIG. 5B is a circuit diagram of a decoupling loop for the integrated circuit package of FIG. 5A.
Figure 6A:
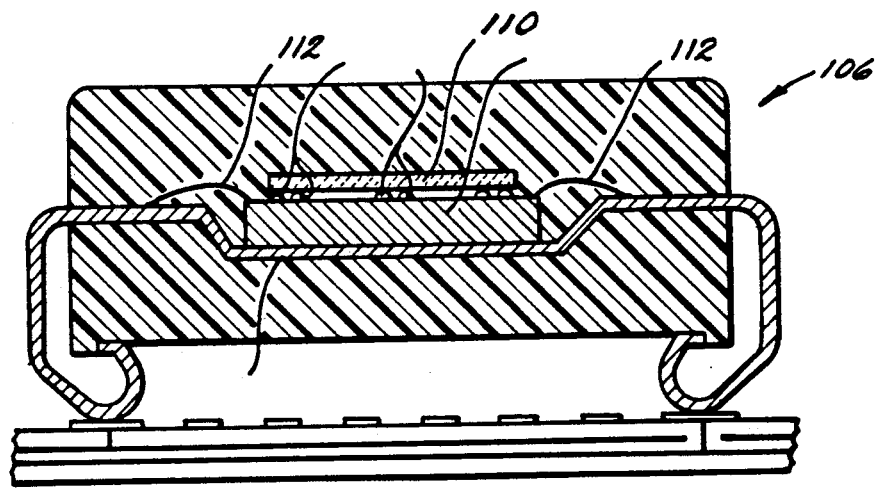
FIG. 6A is a cross-sectional elevation view of an internally decoupled IC package in accordance with a second embodiment of present invention.
Figure 6B:
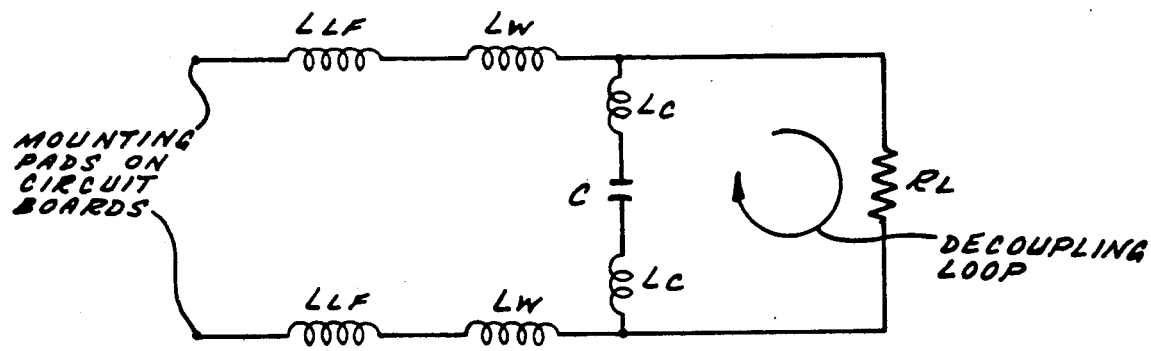
FIG. 6B a circuit diagram of a decoupling loop for the integrated circuit package of FIG. 6A.

Turning now to FIG. 5B, the decoupling loop of the internally decoupled IC package of FIG. 5A is shown. In the decoupling loop of the IC package of FIG. 5A, $L_{LF}$ is equal to the inductance of the leads 94 from the point of connection to the surface mountable pads 101' and to the point of contact with the bonding wire 88; $L_W$ is equal to the inductance of the bonding wire; $L_C$ is equal to the inductance of the bumps (voltage/ground) of the decoupling capacitor plus the capacitance of the decoupling capacitor itself; C is equal to 10 the capacitance of the decoupling capacitor; and $R_L$ is equal to the resistive load representing the power consumed by the IC.

Turning now to FIG. 6A, an internally decoupled IC package in accordance with a second embodiment of the present invention is shown generally at 106. IC package 106 is substantially similar to IC package 80 with the differences residing in the structure of the IC die 108 and decoupling capacitor 110. It will therefore be appreciated that any corresponding structure will have the same reference numeral as that set forth in FIG. 5A. In FIG. 6A, IC die 108 is provided with a plurality of metallic bumps 112 corresponding to the voltage and ground connections of the IC. Suitable pads are provided on decoupling capacitor 110 in a cooperating arrangement to be received by the bumps 112.

An electronic circuit depicting the decoupling scheme for IC package 106 is shown in FIG. 6B. In this circuit: $L_{LF}$ is equal to the inductance of the leads from the point of contact to the surface mounting pads and to the point of contact of the bonding wire; $L_W$ is equal to the inductance of the bonding wire; $L_C$ is equal to the inductance of the "bumps" on the IC die plus the inductance of the decoupling capacitor itself; C is equal to the capacitance of the decoupling capacitor; and $R_L$ is equal to the resistive load representing the power consumed by the IC.

Figure 7:
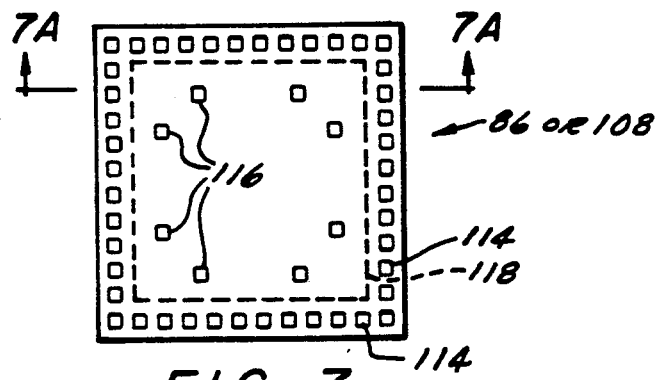
FIG. 7 is a top plan view of a decoupling capacitor mounted on an integrated circuit die.
Figure 7A:
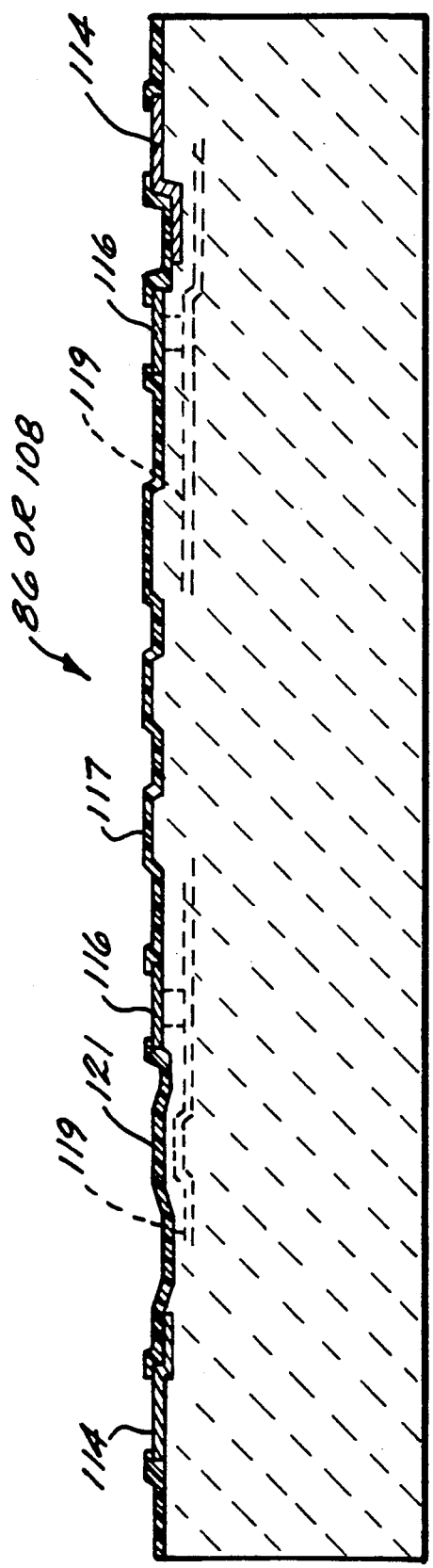
FIG. 7A is a cross-sectional elevational view along the line 7A—7A of FIG. 7.

In both of the embodiments of FIGS. 5A and 6A, the decoupling capacitor (102 or 110) is placed on top of the IC die (86 or 108) and connected to the IC die with conductive "bumps" created either on the capacitor (FIG. 5A) or on the IC die itself (FIG. 6A). This decoupling scheme requires that voltage and ground connection pads be created on the surface of the IC die. Such connection pads are spaced in from the periphery of the IC and are in addition to those pads already located along the periphery of the IC die. An example of a modified IC die (86 or 108) for use in the present invention is shown in FIGS. 7 and 7A. In these respective top and cross sectional views of an IC die, a plurality of surface pads 114 are located along each of the four sides of the die (made from a suitable semi-conductive material) in a well known configuration. As indicated in FIGS. 7 and 7A, some of these outer surface pads 114 are connected to the ground and voltage planes within the IC die itself. In accordance with the present invention, additional inner voltage and ground connection pads 116 are provided on the surface of the IC in addition to the conventional pads 114 located along the perimeter thereof. Preferably, these inner IC pads 116 are located as close as possible to the outer pads 114 to minimize the inductance of the internal interconnection between the correspondin $V_{CC}$ and ground pads; but are located far enough from the periphery of the IC so that the decoupling capacitor does not interfere with the wire bonding process. Both objectives can be achieved by properly dimensioning the decoupling capacitor (whose location after mounting is indicated by the dashed lines 118); and by proper layout on the top surface of the IC die itself. As shown in FIG. 7A, pads 114, 116 are defined by first layers of metallization and are spaced apart by a passivation layer 117 (e.g., silicon oxide, silicon nitride). A second metallization layer 119 may be connected to voltage or ground pads 114, 116 and is separated from pads 114, 116 by an insulative layer 121 of silicon oxide. In accordance with well known internal IC construction, metallization layer 119 is connected to a variety of transistors, diodes, resistors, etc. formed in a well known manner. Pads 116 may also be connected to the metallization layers which form pads 114 (in the event that the pads 114 are voltage or ground wire bonding sites).

By comparing the several embodiments of the present invention shown in FIGS. 5A and 6A with the previously described decoupling schemes of FIGS. 1-4, it will be appreciated that the decoupling scheme of the present invention inherently has the lowest inductance. In addition, it will be appreciated that the decoupling loop of FIGS. 5B and 6B is reduced to that (essentially) of the capacitor itself (which, in the absence of leads is very small), plus the inductance of the internal IC connection from the bonding pads on the periphery to the inner surface of the IC. Again, this inductance can be minimized by making those pads as close as possible to the periphery without interfering with the wire bonding area and process. The bumps themselves will provide very little inductance as the bumps are very small (0.004-0.008" in diameter or 0.004"×0.004" when square and about 0.005" in height).

Figure 8:
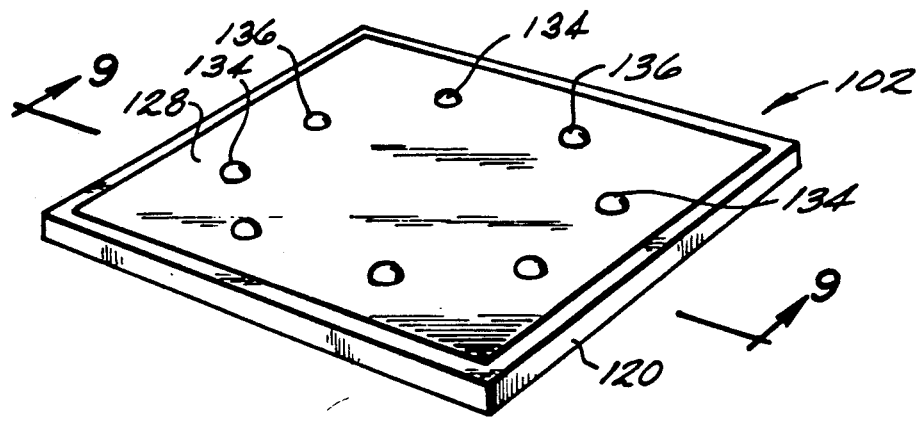
FIG. 8 is a perspective front view of a decoupling capacitor for use in the first embodiment of the present invention.
Figure 9:
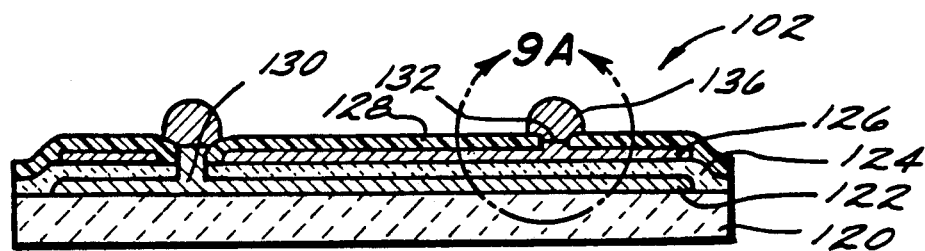
FIG. 9 is a cross-sectional elevation view along the line 9—9 of FIG. 8.
Figure 9A:
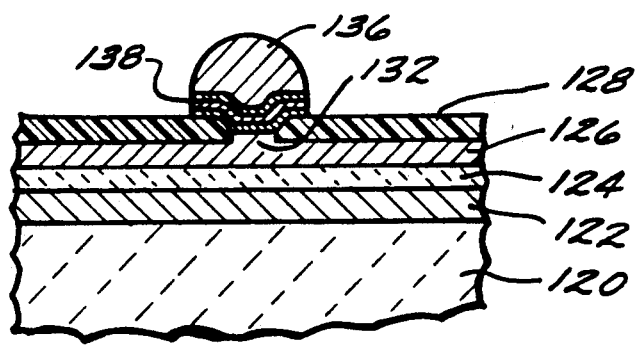
FIG. 9A is an enlarged cross-sectional view of a portion of the decoupling capacitor depicted in FIG. 9.

Turning now to FIGS. 8, 9 and 9A, a decoupling capacitor 102 in accordance with the embodiment depicted in FIG. 5A is shown. Capacitor 102 comprises a ceramic substrate which may be made from alumina, aluminum nitride, beryllia or any other suitable ceramic material. On top of substrate 120 is provided the capacitor structure which may be built up using any thick film or thin film technique such as those disclosed in detail in U.S. Application Ser. Nos. 479,071 and 479,095, both of which were filed on Feb. 12, 1990 and both of which have been incorporated herein by reference. In a preferred method of making the capacitive structure, a first or lower metal layer 122 (silver palladium, silver platinum, etc.) is disposed by screen printing and firing or by vapor deposition, sputtering, plating, etc. Next, a dielectric layer 124 comprised of a suitable dielectric material is provided over lower conductor 122. Dielectric layer 124 may be made of any suitable dielectric material including barium titanate, lead magnesium niobate or the like. Dielectric layer 124 may be deposited onto lower electrode 122 by screen printing (in the form of a glass ceramic thick film paste) and firing to a fired thickness of about 0.001" for low self inductance. Alternatively, dielectric layer 124 may be manufactured by means of a sol gel deposition of a dielectric thin film (of thickness between 1.0 microns to 10.0 microns) and lower temperature sintering or by chemical vapor deposition processing as described in the previously referenced pending patent applications.

The second or top conductor 126 comprises a metal layer which is deposited onto the dielectric layer 124 by screen printing a silver palladium, silver platinum (or other adequate metal combination) paste and firing; or by vapor metal deposition of nickel, chromium or the like. Next, an outer passivation layer 128 is deposited onto upper conductor 126. Passivation layer 128 is comprised of a layer of glass, SiN or other adequate insulating material. As shown in FIGS. 9 and 9A, all of the layers 122, 124, 126 and 128 are provided with appropriate openings therethrough so that a conductive via 130 extends from lower electrode 122 and is exposed at or near the surface of passivation layer 126. Similarly, a conductive via is formed from second electrode 126 to at or near the surface of passivation layer 126. Note that with regard to via 130, the passivation layer 128 insulates via 130 from the second electrode 126. Each via 130 and 132 is provided with a conductive bump 134 and 136. Preferably, conductive bumps 134, 136 are made from a suitable solder such as known lead tin solder materials. Also, in a preferred embodiment, an adherence layer (shown at 138 in FIG. 9A) is provided between the solder bump 136 and both the passivation layer 128 and via 132 (or 30). The adherence layer 138 is preferably a copper solderable layer comprised of a chromium or nickel material.

As already discussed, during use, decoupling capacitor 102 is flipped over (relative to FIG. 8) so that the passivation layer 128 and solder bump 136 surface of capacitor 102 is in facing relation to the top surface of the die (the surface shown in FIG. 7) whereupon the solder bumps 134 and 136 will electrically mate with the corresponding voltage and ground pads 116 on the IC die 86.

Preferably, the capacitive layers have an overall thickness of less than or equal to 0.0024 inch with the dielectric layer 124 having a thickness of less than or equal to 0.0001 inch and the ceramic substrate 120 having a thickness of about 0.008 to 0.010 inch.

Figure 10:
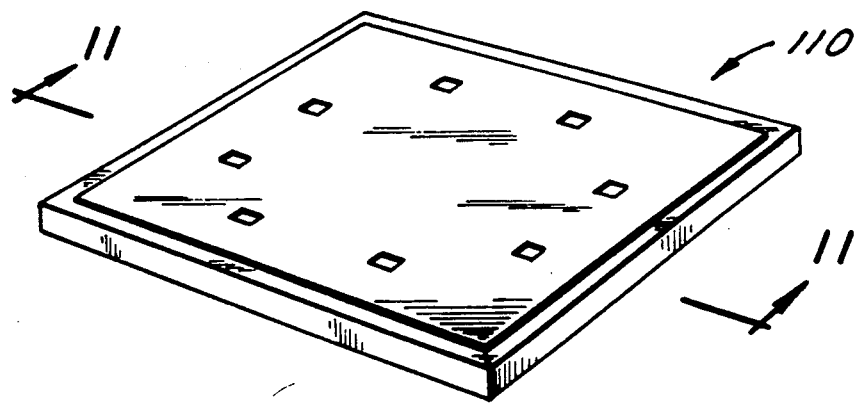
FIG. 10 is a perspective view of a decoupling capacitor used in accordance with the second embodiment of the present invention.
Figure 11:
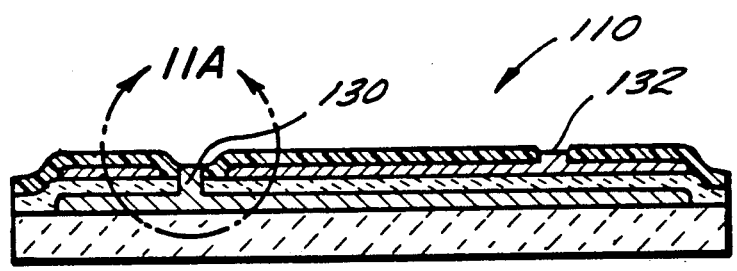
FIG. 11. is a cross-sectional elevation view along the line 11—11 of FIG. 10.
Figure 11A:
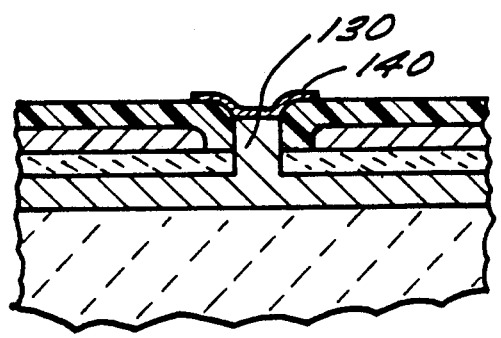
FIG. 11A is an enlarged cross-sectional view of depicting a portion of the decoupling capacitor of FIG. 11.

Turning now to FIGS. 10, 11 and 11A, a decoupling capacitor 110 for use in accordance with the second embodiment of the present invention shown in FIG. 6A is depicted. Decoupling capacitor 110 is substantially similar to decoupling capacitor 102 with the corresponding elements utilizing the same reference numerals. The primary difference is that in decoupling capacitor 110, no solder bumps are necessary as the solder bumps will be provided onto the bonding sites 116 on the top surface of the integrated circuit die. Thus, each via 130 and 132 defines a recess in the passivation layer 128 for receiving a solder bump which has been positioned on a contact pad 116 and IC die 108. As shown in FIG. 11A, in a preferred embodiment, conductive adhesion between the decoupling capacitor 110 and IC die 108 is insured by providing an appropriate solder layer 140 in each via recess. This is to assure good solderability and electrical contact between the IC die bumps and the electrodes of the decoupling capacitor. This layer 140 of solder can be deposited by vapor deposition and reflowed to homogenize the compositions of the layers since lead and tin evaporate at different temperatures and rates. It will be appreciated that the composition of the solder will control its melting temperature which should be high enough to prevent reflowing during the normal IC assembly processing (die attach, wire bonding, TAB bonding, encapsulation, etc).

Figure 13:
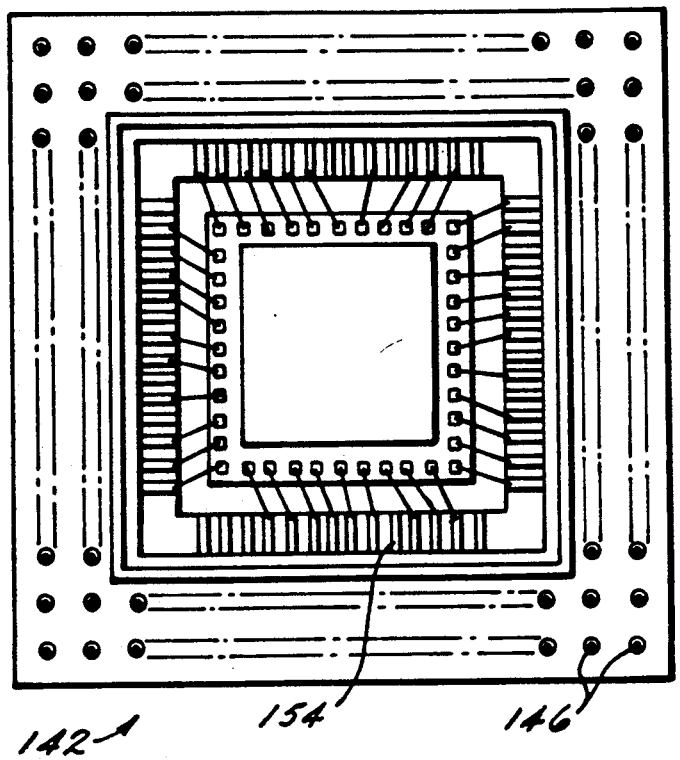
FIG. 13 is a bottom view of the PGA package of FIG. 12.
Figure 14:
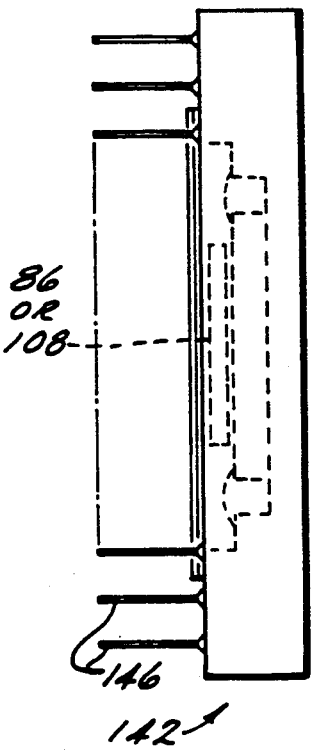
FIG. 14 is a side elevation view of the PGA package of FIG. 13.
Figure 12:
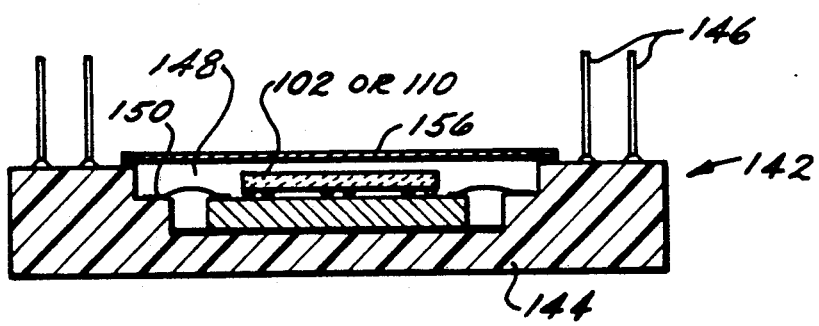
FIG. 12 is a cross-sectional elevation view depicting an internally decoupled IC in a pin grid array package.

The decoupling scheme in accordance with the present invention has been illustrated in conjunction with a plastic molded IC package (FIGS. 5A and 6A). However, as discussed above, the present invention is equally applicable to any other IC packaging technique. For example, FIGS. 12-14 show another embodiment of the present invention as used in conjunction with a pin grid array (PGA) package. Referring now to FIGS. 12-14, the PGA package is shown generally at 142 and comprises a generally square housing 144 having a plurality of pins 146 extending upwardly from a bottom surface thereof. The central area of the bottom surface is pin free and includes a cavity 148 which houses the IC die 86 or 108 having a decoupling capacitor 102 or 110 as described in detail hereinabove. As is well known and as is best shown in FIGS. 12 and 13, cavity 148 has exposed wire bonding tiers 150, 152 which provide wire bonding sites between outer wire bonding pads 114 of IC die 86, 108 and contacts 154 on wire bonding tiers 150, 152. Note that the lid 156 shown in FIG. 12 has been removed in FIG. 13 for clarity.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An integrated circuit package comprising:
   a housing;
   an integrated circuit (IC) chip in said housing, said IC chip including a planar surface having a first plurality of contact pads peripherally arranged therealong and a second plurality of contact pads spaced inwardly from said first pads, said second pads corresponding to voltage and/or ground connections of said IC chip;
   a decoupling capacitor on said planar surface of said IC chip, said decoupling capacitor including a planar surface having a third plurality of contact pads arranged in a pattern corresponding to said second pads on said IC chip; and
   connecting means for electrically interconnecting said second and third pads wherein said decoupling capacitor is electrically connected to said voltage and/or ground connections of said IC chip.

2. The IC package of claim 1 wherein said connecting means comprises:
   a conductive bump deposited on each of said second contact pads.

3. The IC package of claim 2 wherein:
   said conductive bump comprises solder.

4. The IC package of claim 1 wherein said connecting means comprises:
   a conductive bump deposited on each of said third contact pads.

5. The IC package of claim 4 wherein:
   said conductive bump comprises solder.

6. The IC package of claim 1 wherein said decoupling capacitor comprises:
   a non-conductive support substrate;
   a first electrode on said support substrate;
   at least one layer of dielectric material on said first electrode;
   a second electrode on said layer of dielectric material with said dielectric material being sandwiched between said first and second electrodes;
   a non-conductive layer on said second electrode;
   a plurality of spaced first conductive vias extending from said first electrode through said dielectric material, said second electrode and said non-conductive layer;
   a plurality of spaced second conductive vias extending from said second electrode and through said non-conductive layer;
   said first and second vias terminating at said third contact pads.

7. The IC package of claim 6 including:
   a conductive bump deposited on each of said third contact pads.

8. The IC package of claim 7 including:
   an adherence layer between said third contact pad and said conductive bump.

9. The IC package of claim 8 wherein:
   said adherence layer comprises nickel or chromium.

10. The IC package of claim 6 including:
    a solder layer on each of said third contact pads.

11. The IC package of claim 6 wherein:
    said electrodes are screen printed, vapor deposited or sputtered.

12. The IC package of claim 6 wherein:
    said dielectric layer comprises a thin deposited layer of ceramic paste or dielectric sol-gel.

13. The IC package of claim 12 wherein:
    said dielectric layer has a thickness of less than or equal to 0.001 inch.

14. The IC package of claim 6 wherein:
    said capacitor has a thickness of less than or equal to 0.0024 inch.

15. The IC package of claim 6 wherein:
    said support substrate comprises a ceramic material.

16. The IC package of claim 15 wherein:
    said ceramic substrate has a thickness of about 0.008 to 0.010 inch.

17. An integrated circuit chip comprising:
    a block of semi-conductive material including a planar surface having a first plurality of contact pads peripherally arranged therealong and a second plurality of contact pads spaced inwardly from said first pads, said second pads corresponding to voltage and/or ground connections of said IC chip.

18. A decoupling capacitor comprising:
    a non-conductive support substrate;
    a first electrode on said support substrate;
    at least one layer of dielectric material on said first electrode;
    a second electrode on said layer of dielectric material with said dielectric material being sandwiched between said first and second electrodes;
    a non-conductive layer on said second electrode;
    a plurality of spaced first conductive vias extending from said first electrode through said dielectric material, said second electrode and said non-conductive layer;
    a plurality of spaced second conductive vias extending from said second electrode and through said non-conductive layer; and
    a plurality of contact pads on said non-conductive layer, said first and second vias terminating at said contact pads.

19. The capacitor of claim 18 including:

a conductive bump deposited on each of said contact pads.

20. The capacitor of claim 19 including:
an adherence layer between each of said contact pads and said conductive bumps.

21. The capacitor of claim 20 wherein:
said adherence layer comprises nickel or chromium.

22. The capacitor of claim 18 including:
a solder layer on each of said contact pads.

23. The capacitor of claim 18 wherein:
said electrodes are screen printed, vapor deposited or sputtered.

24. The capacitor of claim 18 wherein:
said dielectric layer comprises a thin deposited layer of ceramic paste or dielectric sol-gel.

25. The capacitor of claim 24 wherein:
said dielectric layer has a thickness of less than or equal to 0.001 inch.

26. The capacitor of claim 18 wherein:
said capacitor has a thickness of less than or equal to 0.0024 inch.

27. The capacitor of claim 18 wherein:
said support substrate comprises a ceramic material.

28. The capacitor of claim 27 wherein:
said ceramic substrate has a thickness of about 0.008 to 0.010 inch.

* * * * *

UNITED STATES PATENT AND TRADEMARK OFFICE
CERTIFICATE OF CORRECTION

PATENT NO. : 5,095,402
DATED : March 10, 1992
INVENTORS : Jorge M. Hernandez and Michael S. Hyslop It is certified that error appears in the above-identified patent and that said Letters Patent is hereby corrected as shown below:

Col. 1, line 58-59, The sentence has been split into two paragraphs; connect "...layer into a" and "PGA ceramic..." so as to form a single paragraph.

Col. 2, line 64, After "3B" insert --is--.

Col. 3, line 10, After "of" and before "present" insert --the--.

Col. 4, line 49, After "wherein" delete ";" and insert therefore --:--.

Col. 5, line 45, Delete "o" and insert therefore --of--.

Col. 6, line 19, delete --10--.

Col. 7, line 4, Delete "correspondin" and insert therefore --corresponding--.

Col. 8, line 17, After "conductive via" insert --132--.

Col. 8, line 26, Delete "(or 30)" and insert therefore --(or 130)--.

Signed and Sealed this

Fifth Day of October, 1993

Attest:

BRUCE LEHMAN

Attesting Officer

Commissioner of Patents and Trademarks